United States Patent [19]

Tanaka et al.

[11] Patent Number: 4,532,612
[45] Date of Patent: Jul. 30, 1985

[54] DYNAMIC READ ONLY MEMORY

[75] Inventors: Fuminari Tanaka; Yoshihiro Iwamoto, both of Kawasaki, Japan

[73] Assignee: Tokyo Shibaura Denki Kabushiki Kaisha, Japan

[21] Appl. No.: 450,049

[22] Filed: Dec. 15, 1982

[30] Foreign Application Priority Data

Dec. 16, 1981 [JP] Japan .................................. 56-202802

[51] Int. Cl.³ ............................................. G11C 11/40
[52] U.S. Cl. .................................... 365/227; 365/226; 365/230
[58] Field of Search ................ 365/226, 227, 230, 189

[56] References Cited

U.S. PATENT DOCUMENTS 3,405,399  10/1968  Chong et al. ........................ 340/174

Primary Examiner—Terrell W. Fears
Attorney, Agent, or Firm—Finnegan, Henderson, Farabow, Garrett & Dunner

[57] ABSTRACT

A dynamic read only memory comprises a plurality of ROM blocks and a control circuit composed of a plurality of MOSFETs respectively connected to the column lines. The control circuit keeps the data from the ROM block not containing a specified memory cell at a discharged level.

3 Claims, 16 Drawing Figures

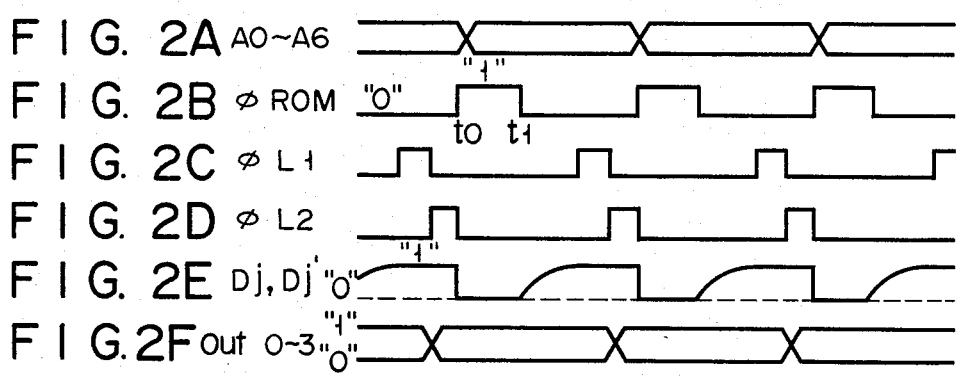
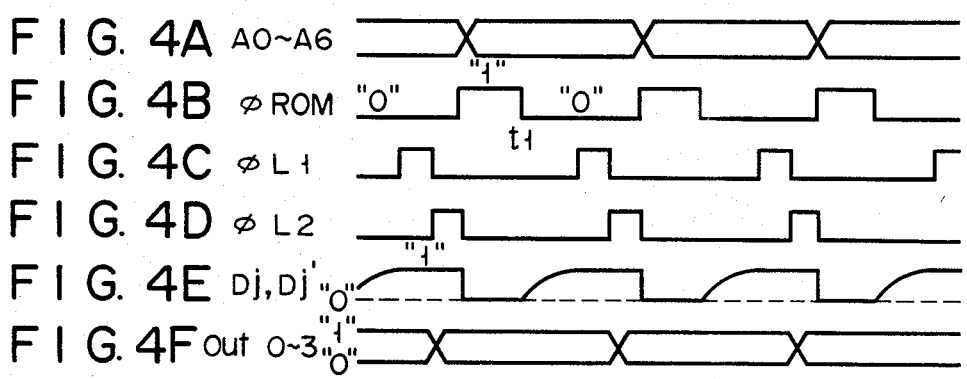
FIG. 6
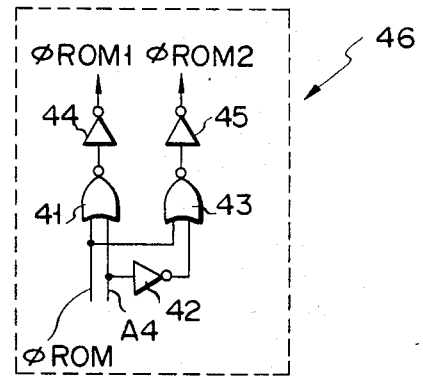

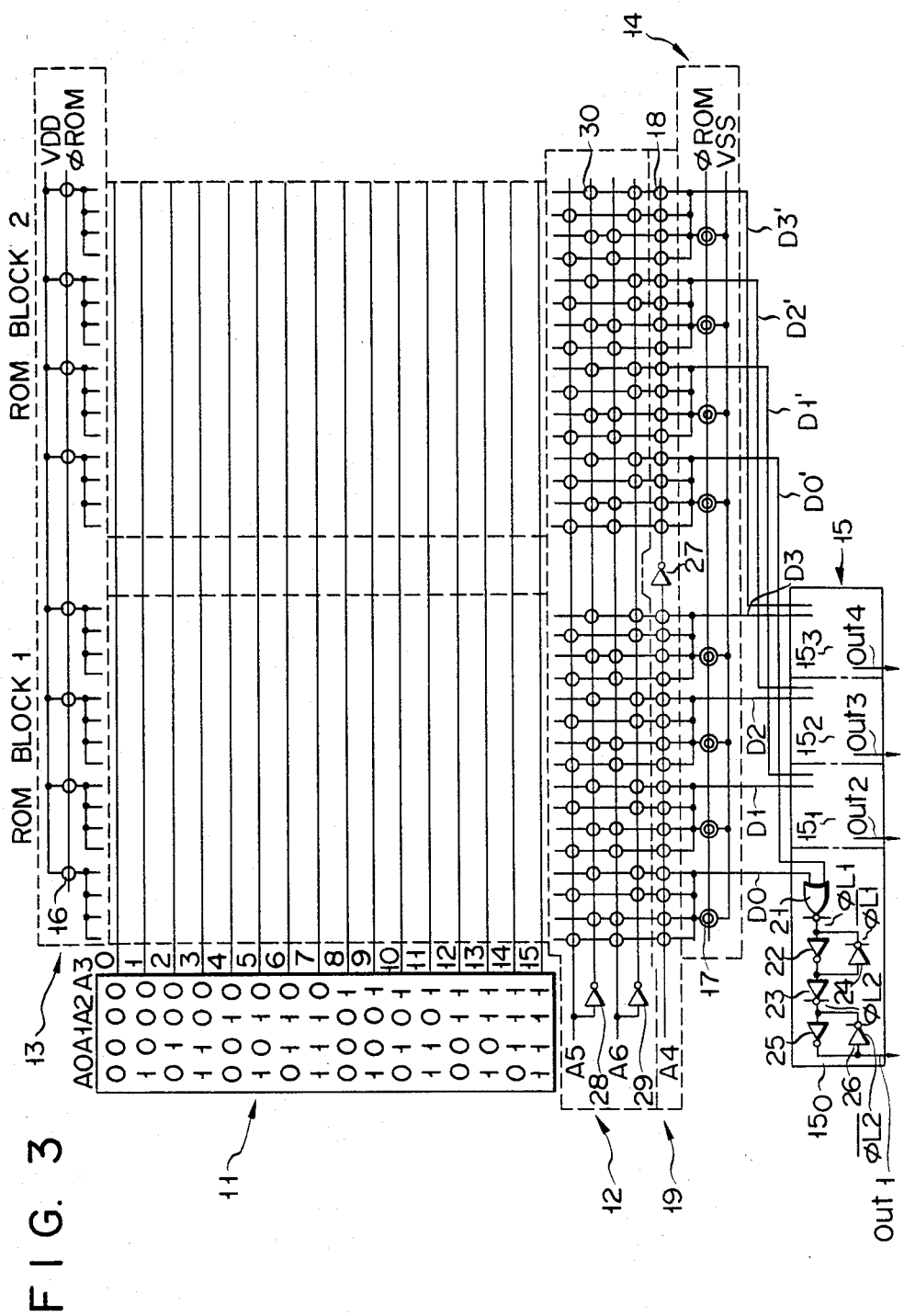
F I G. 3

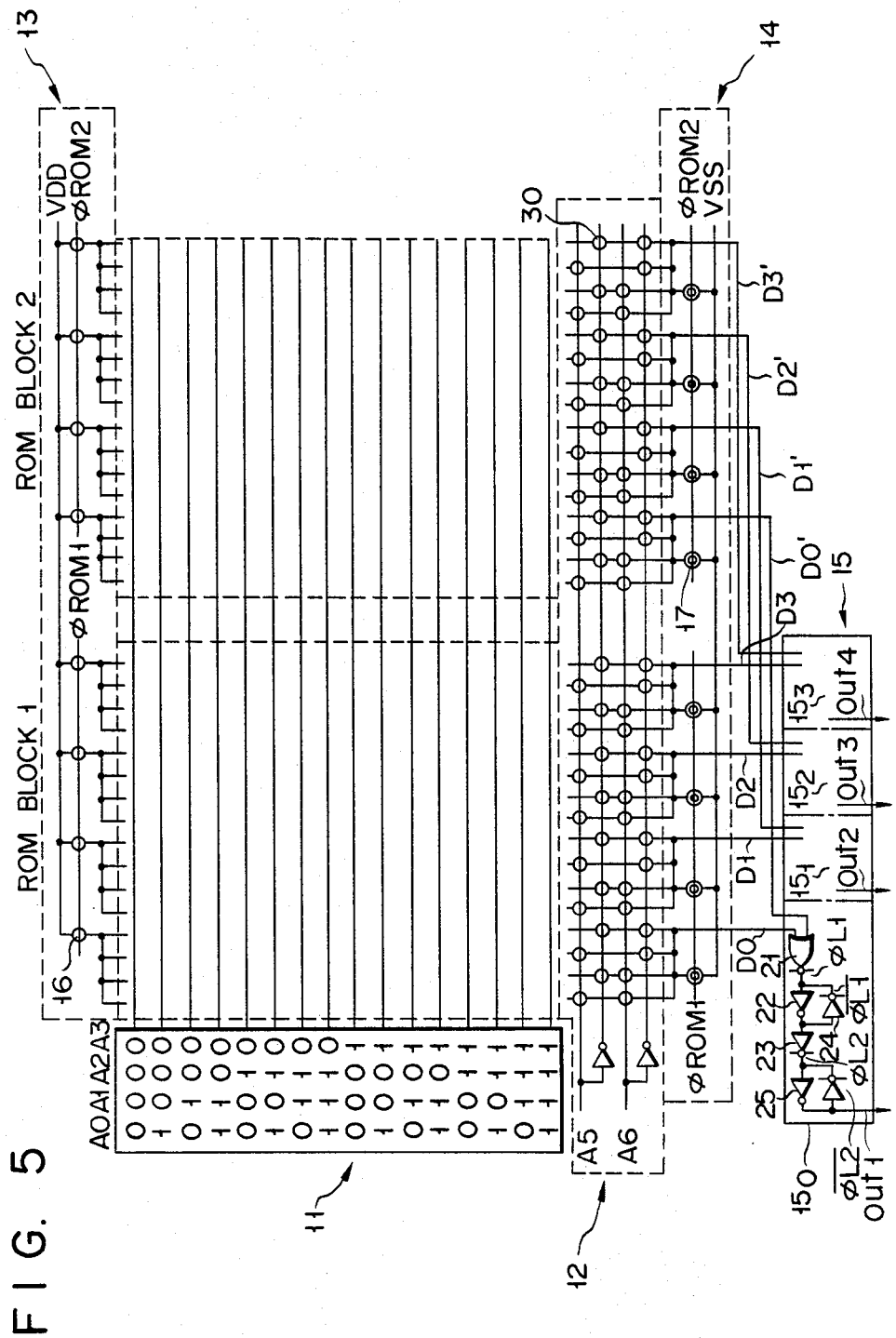
F I G. 5

DYNAMIC READ ONLY MEMORY

BACKGROUND OF THE INVENTION

The present invention relates to a dynamic read only memory with a large capacity.

In the dynamic read only memory (referred to as a dynamic ROM) with large capacity, it is a common practice that the memory area is divided into n blocks for improving the frequency characteristics. An example of such a ROM is illustrated in FIG. 1. The timing charts for explaining the operation of the FIG. 1 ROM are shown in FIGS. 2A to 2F. The ROM of FIG. 1 is made up of two blocks, ROM block 1 and ROM block 2, and has a total memory capacity of 512 bits. In FIG. 1, numeral 1 designates an address decoder, 2 a column address decoder, 3 a precharge circuit, 4 a discharge circuit, and 5 a latch circuit for fetching data stored in ROM block 1 and ROM block 2 by a clock $\phi_{L1}$ (FIG. 2C) and outputting the same by a clock $\phi_{L2}$ (FIG. 2D). Reference numeral 6 represents a P channel MOSFET (metal oxide semiconductor field effect transistor), 7 an N channel MOSFET, $V_{DD}$ a power source potential, and $V_{SS}$ a reference potential, for example, ground potential.

As shown in FIGS. 2A to 2F, when the clock pulse $\phi_{ROM}$ (FIG. 2B) is "1" a time $t_0$, all the N channel MOSFETs 7 in the discharge circuit 4 are ON. Further, the column lines in ROM block 1 and ROM block 2 are discharged and these output data are reset to "0". When at time $t_1$ the clock pulse $\phi_{ROM}$ is "0", the N channel MOSFETs 7 are all OFF, while the P channel MOSFETs 6 in the precharge circuit 3 are all ON. Then address inputs $A_5$ and $A_6$ designate one of four output lines for each of output data Dj (J=0-3) and address inputs Ai (i=0-4) designate one of the row lines so that a cell is selected. In response to data at the selected cell, the output line of the selected cell is charged as shown by a solid line in FIG. 2E or kept at a discharge state as shown by a broken line in FIG. 2E. When the clock $\phi_{L1}$ is "1" the output data Dj on the output line of the selected cell is latched in the latch circuit 5. Then, when the clock $\phi_{L2}$ is "1", the data Dj stored in the latch circuit 5 is output as output data (FIG. 2F). In ROM block 1 and ROM block 2, output data Dj or Dj' (j=0-3) from the non-selected block (i.e. the memory block which does not include a selected cell) are all "1". For example, when ROM block 1 is selected, output data $D_0'$ to $D_3'$ of the non-selected ROM block 2 are all "1". This fact indicates that for every reading operation, the charge or discharge current flows through the output lines of the output data Dj' (j=0-3) of the non-selected ROM block, thereby wasting electric power.

SUMMARY OF THE INVENTION

Accordingly, an object of the present invention is to provide a dynamic read only memory substantially eliminating wasteful power consumption in the non-selected ROM block.

According to the invention, there is provided a dynamic read only memory comprising:

memory cells arranged in a matrix fashion and grouped into a plurality of blocks;

an address decoder for decoding an address signal to designate one of said memory cells;

means for reading out data from a selected column line to which said designated memory cell is connected and latching it therein; and control means for outputting the data as is from said memory cell block containing said designated memory cell and keeping the data from said memory cell block not containing said designated memory cell at a predetermined level.

BRIEF DESCRIPTION OF THE DRAWINGS

FIGS. 2A to 2F are timing charts useful in explaining the operation of the dynamic ROM of FIG. 1;

FIG. 3 is a circuit diagram of an embodiment of a dynamic ROM according to the present invention;

FIGS. 4A to 4F are timing diagrams useful in explaining the operation of the FIG. 3 embodiment;

FIG. 5 is a circuit diagram of another embodiment of a dynamic ROM according to the present invention; and FIG. 6 is a circuit diagram of a clock generator for generating clocks $\phi_{ROM1}$ and $\phi_{ROM2}$ to be applied to the dynamic ROM of FIG. 5.

DETAILED DESCRIPTION OF THE PREFERRED EMBODIMENTS

Figure 1:
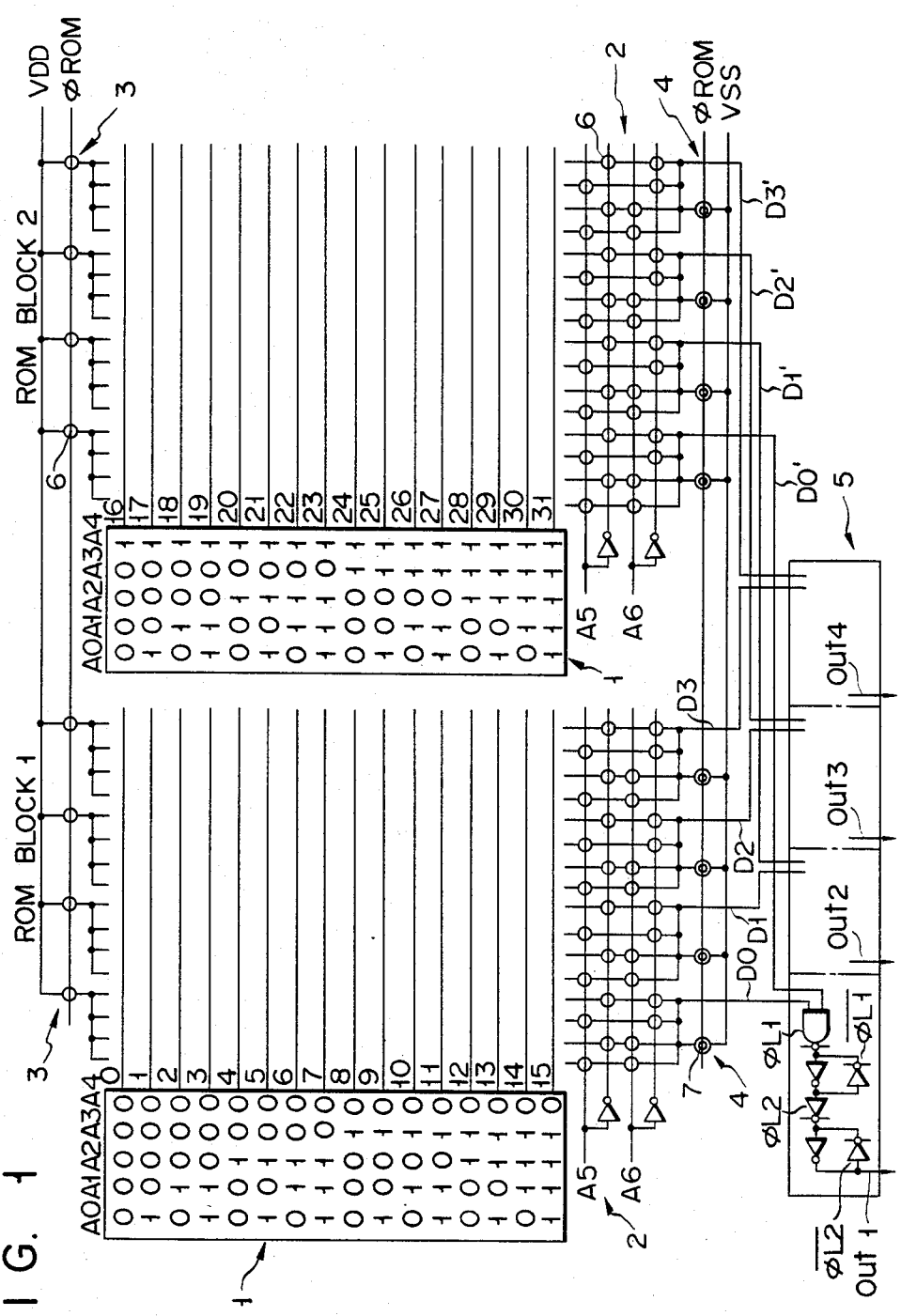
FIG. 1 is a circuit diagram of a prior dynamic ROM.

Referring to FIG. 3, there is shown a dynamic ROM incorporating the present invention. In the present embodiment, an array of memory cells of the dynamic ROM is divided into ROM block 1 and ROM block 2. Sixteen row lines 0 to 15 are commonly used for both the block 1 and the block 2. The blocks 1 and 2 are of 4-bit output (Dj, Dj' (j=1-3)) construction, respectively. The outputs Dj and Dj' have four output lines (i.e. column lines), respectively. Actually, the row lines and the column lines are crossed to form a matrix array having memory cells at the cross points, although not shown for the sake of simplicity.

A row decoder 11 receives and decodes address signals $A_0$ to $A_3$, and selects any one of sixteen row lines. A column decoder 12 receives and decodes address signals $A_5$ to $A_6$, and selects one of four column lines in the outputs Dj and Dj' (j=0-3). Reference numeral 13 designates a precharge circuit. The precharge circuit 13 is made up of eight P channel MOSFETs 16 provided so as to correspond to the 4-bit outputs Dj and Dj' (j=0-3) of each of the ROM blocks 1 and 2. Actually, the source of each P channel MOSFET 16 is connected to $V_{DD}$ and its drain to the corresponding output lines.

The P channel MOSFET 16 is turned on and off by the clock pulse $\phi_{ROM}$ (FIG. 4B) applied to the gate thereof.

Eight N channel MOSFETs 14 are provided corresponding to the outputs Dj and Dj' (j=0-3) in the ROM blocks 1 and 2. The N channel MOSFET 17 is turned on and off by the clock $\phi_{ROM}$ applied to the gate thereof, and is symbolically illustrated. The source of the N channel MOSFET 17 is coupled with reference potential $V_{SS}$ and its drain to the corresponding outputs Dj and Dj' (j=0-3).

Numeral 15 designates a delay circuit for latching data Dj and Dj' (j=0-3) of the bit outputs of the ROM blocks 1 and 2. The delay circuit 15 is made up of four sections (4-bit outputs) $15_0$ to $15_3$ with the same arrangements. The delay circuit section $15_0$ is comprised of a NOR gate 21 and inverters 22 to 26. The NOR gate 21 receives output data $D_0$ from the first bit of the 4-bit output in the block 1 and output data $D_0'$ from the first bit of the 4-bit output in the block 2. The inverter 22 phase-inverts the output signal from a NOR gate 21. The inverter 23 phase-inverts the output signal from the inverter 22. The inverter 24 phase-inverts the output signal from the inverter 23 and leads it to the same inverter 22. The inverter 25 phase-inverts the output signal from the inverter 23 and applies it to the delay circuit section $15_0$. The inverter 26 phase-inverts the output signal from the inverter 25 and applies it to the inverter 25. The NOR gate 21 and the inverter 24 are of the clocked type and respond to the clock pluse $\phi_{L1}$. The inverters 23 and 26 are of the clocked type and respond to the clock $\phi_{L2}$.

The remaining delay circuit sections $15_1$, $15_2$, and $15_3$ have also substantially the same arrangements, respectively. The delay circuit section $15_1$ receives data $D_1$ from the second bit in ROM block 1 and data $D_1'$ from the second bit in ROM block 2. The section $15_2$ receives data $D_2$ from the third bit in ROM block 1 and data $D_2'$ from the third bit in ROM block 2. Similarly, the section $15_3$ receives data $D_3$ from the fourth bit in ROM block 1 and data $D_3'$ from the fourth bit in ROM block 2.

A control circuit 19, provided between the discharge circuit 14 and the column decoder 12, is comprised of P channel MOSFETs 18, is gated with an address signal $A_4$ applied to its gate. As will subsequently be described in detail, the MOS transistor 18 functions to keep the data from the unselected ROM block at the potential as given after the discharge of the output level. The address signal $A_4$ is directly applied to the MOS transistor 18 connected to the column lines in the ROM block 1. The address signal $A_4$ is inverted by an inverter 27 and applied as a signal $\bar{A}_4$ to the column lines in the ROM block 2. Thus, the MOSFETs 18 in the ROM block 1 and these in the ROM block 2 are respectively applied with address signals of which the phases are opposite to each other.

The column decoder 12 is comprised of P channel MOSFETs 30 provided at cross points of the signal line for the address signal $A_5$ and the column lines, the signal line for the address signal $A_5$ after it is passed through an inverter 28 and the column lines, the signal line for the address input $A_6$ and the column lines, and the signal line for the address signal $A_6$ after it is passed through an inverter 29 and the column lines.

The operation of the embodiment as mentioned above will be given. As shown in FIGS. 4A to 4F, at time $t_1$, the clock $\phi_{ROM}$ (FIG. 4B) changes from "1" to "0". At this time, all the N channel MOSFETs 17 are OFF and all the P channel MOSFETs 16 in the precharge circuit 13 are ON. Then, the column lines in the ROM block 1 and the ROM block 2 are charged. Under this condition, the address signals $A_0$ to $A_3$ (FIG. 4A) are applied to the row decoder 11. The address signal $A_5$ and $A_6$ (FIG. 4A) are applied to the column decoder 12. Thus, the desired memory cells are designated. Further, when the clock signal $\phi_{L1}$ (FIG. 4C) is "1", the NOR gate 21 in the delay circuit 15 is enabled to allow the data (FIG. 4E) to be loaded into the latch circuit 15 from the selected column lines to which the designated memory cells are connected. The data is latched until the clock $\phi_{L2}$ (FIG. 4D) is "1". And when it is "1", the gate of the inverter 23 is enabled and the latched data is output as output data (FIG. 4F).

For example, when the selected cell is contained in the ROM block 1, the address signal $A_4$ is "0". As a result, of the MOSFETs 18 in the control 19, the MOSFETs 18 connected to the ROM block 1 are ON. On the other hand, the MOSFETs 18 connected to the ROM block 2 are impressed with "1" signal $\bar{A}_4$ through the inverter 27. The MOSFETs 18 coupled with the ROM block 2 are OFF. Therefore, whereas the data $D_0$ to $D_3$ from the ROM block 1 are at the level of the data stored in the selected column lines, the data $D_0'$ to $D_3'$ from the non-selected block 2 are kept at the level as given after discharge, i.e., "0". This indicates that no charge and discharge current flow into the output lines in the non-selected block 2, and this fact brings about power saving.

Another embodiment of the present invention will be described referring to FIG. 5. In the figure, like reference numerals are used for designating like or equivalent portions in FIG. 3. In the present embodiment, the ROM block 1 and the ROM block 2 are controlled by first and second $\phi_{ROM1}$ and $\phi_{ROM2}$, although such control is performed by the control circuit 19 in the FIG. 3 embodiment. Of the MOSFETs 16 in the precharge circuit 13, those transistors 16 contained in the ROM block 1 are under control of the clock $\phi_{ROM1}$. The transistors in the ROM block 2 are under control of the clock $\phi_{ROM2}$. Of the transistors 17 in the discharge circuit 14, the transistors 17 contained in the ROM block 1 are controlled by the clock $\phi_{ROM1}$. The transistors contained in the ROM block 2 are controlled by the clock $\phi_{ROM2}$. The clock signals $\phi_{ROM1}$ and $\phi_{ROM2}$ are generated by a clock generator 46. The clock generator 46 is comprised of a NOR gate 41 for receiving the clock $\phi_{ROM}$ and the address signal $A_4$, the inverter $A_4$ for inverting the phase of the address signal $A_4$, a NOR gate 43 for receiving the clock $\phi_{ROM}$ and the output signal from the inverter 42, an inverter 44 for inverting the phase of the output from the NOR gate 41, and an inverter 45 for inverting the phase of the output signal from the NOR gate 43. The output signal from the inverter 44 is used as the clock $\phi_{ROM1}$ and the output signal from the inverter 45 as the clock $\phi_{ROM2}$.

In the present embodiment, if a cell belonging to the ROM block 1 is addressed, the input $A_4$ is "0". At this time, in the clock generator 46, since the output of the inverter 42 is "1", the second clock $\phi_{ROM2}$ is "1" and the first clock $\phi_{ROM1}$ is "0", if the clock $\phi_{ROM}$ is "0". Therefore, of the P channel MOSFETs 16 is the precharge circuit 13, the transistors 16 contained in the ROM block 1 are ON, and the column lines in the same block are precharged. On the other hand, the column lines contained in the ROM block 2 are not precharged. In the discharge circuit 14, the N channel MOSFETs 17 contained in the ROM block 1 are OFF and the data read out from the outputs (column lines) in the same block are produced in the form of $D_0$ to $D_3$. The N channel MOSFETs 17 contained in the ROM block 2 are ON. The output data $D_0'$ to $D_3'$ from the ROM block 2 are all "0". The ROM block 2 is not precharged and the output data $D_0'$ to $D_3'$ are kept at the same level, or "0", after it is discharged. As a consequence, the waste of power arising from the current flow in the non-selected block 2, which is inevitable in the prior art, is prevented.

When the clock $\phi_{ROM}$ changes its level to "1", the "1" at the output of the inverter 42, the "0" at the output of the NOR gate 43, and the "1" at the output of the inverter 45 remain unchanged. The clock $\phi_{ROM2}$ is kept at "1", and the data $D_0'$ to $D_3'$ are kept at reset state of "0". The clock $\phi_{ROM1}$ is inverted from "0" to "1". The N channel MOSFETs 17 in the discharge circuit 14 are ON and the output data $D_0$ to $D_3$ from the ROM block 1 are also reset to "0". As described above, in the present embodiment, a fixed level signal is applied to the control transistor associated with the non-selected block, whereas a level changing signal as timed with the data read out operation is applied to the control transistor contained in the selected block. In this way, the current flow to the non-selected block is prevented.

As described above, in the present invention, the data output from the non-selected block of the plurality of ROM blocks is kept at the level as given after the cell is discharged, thereby preventing current flow into the non-selected block. This unique circuit arrangement of the invention has successfully reduced power consumption in the memory device.

What we claim is:

1. A dynamic read only memory comprising:
   a plurality of memory cells connected to column lines and arranged in a matrix fashion in a plurality of blocks;
   an address decoder coupled to said plurality of memory cell blocks for decoding an address signal designating one of said memory cells in one of said plurality of blocks;
   means, coupled to said plurality of memory cell blocks, for reading out data from a selected column line to which said designated memory cell is connected and for latching said data;
   control means, coupled to said plurality of memory cell blocks, for outputting to said reading means said data from said memory cell block containing said designated memory cell; and
   means, coupled to said control means, for discharging the outputs from said memory cell blocks not containing said designated memory cell and for maintaining said discharged outputs at a predetermined discharge potential level.

2. A dynamic read only memory according to claim 1, wherein said control means is made up of transistor elements connected to said column lines of said matrix in each of said memory cell blocks, the transistor elements in said memory cell blocks containing said designated memory cell receiving an enable signal to turn on said transistor elements in a read mode, and the transistor elements in said memory cell blocks not containing said designated memory cell receiving a disable signal to turn off said transistor elements in said read mode.

3. A dynamic read only memory according to claim 1, wherein said control means is made up of transistor elements respectively connected to said column lines in said matrix in each of said memory blocks, said transistor elements in said memory cell block containing said designated memory cell receiving a clock signal changing its level, and said transistor elements in said memory cell blocks not containing said designated cell receiving a signal at a predetermined level.

* * * * *